US010006115B2

(12) United States Patent
Gold

(10) Patent No.: US 10,006,115 B2
(45) Date of Patent: Jun. 26, 2018

(54) VACUUM PLASMA SPRAYED COATING INCLUDING OXIDE DISPERSIONS

(71) Applicant: Rolls-Royce Corporation, Indianapolis, IN (US)

(72) Inventor: Matthew R. Gold, Carmel, IN (US)

(73) Assignee: Rolls-Royce Corporation, Indianapolis, IN (US)

(*) Notice: Subject to any disclaimer, the term of this patent is extended or adjusted under 35 U.S.C. 154(b) by 0 days. days.

(21) Appl. No.: 15/084,624

(22) Filed: Mar. 30, 2016

(65) Prior Publication Data
US 2016/0289811 A1 Oct. 6, 2016

Related U.S. Application Data

(60) Provisional application No. 62/141,635, filed on Apr. 1, 2015.

(51) Int. Cl.
C23C 4/18 (2006.01)
C23C 4/06 (2016.01)
C23C 4/134 (2016.01)
C23C 4/137 (2016.01)
B05B 7/22 (2006.01)
C23C 4/04 (2006.01)
H01J 37/32 (2006.01)

(52) U.S. Cl.
CPC .............. C23C 4/18 (2013.01); B05B 7/22 (2013.01); C23C 4/04 (2013.01); C23C 4/06 (2013.01); C23C 4/134 (2016.01); C23C 4/137 (2016.01); H01J 37/3244 (2013.01); H01J 37/32834 (2013.01)

(58) Field of Classification Search
None
See application file for complete search history.

(56) References Cited

U.S. PATENT DOCUMENTS

| 4,419,416 | A | * | 12/1983 | Gupta ............... C22C 19/058 428/656 |
| 5,498,484 | A | | 3/1996 | Duderstadt |
| 5,817,372 | A | | 10/1998 | Lheng |
| 6,393,828 | B1 | | 5/2002 | Zhao et al. |
| 6,866,897 | B2 | | 3/2005 | Wang et al. |
| 7,927,722 | B2 | | 4/2011 | Schlichting et al. |

(Continued)

OTHER PUBLICATIONS

"Solutions Flash, ChamPro LPPS Hybrid Technologies for application of unique, high-performance functional surfaces," Oerlikon Metco, SF-0014.2, Oct. 1, 2014, 12 pp.

(Continued)

Primary Examiner — Joseph A Miller, Jr.
(74) Attorney, Agent, or Firm — Shumaker & Sieffert, P.A.

(57) ABSTRACT

A technique may include controlling a vacuum pump to evacuate a vacuum chamber to high vacuum; controlling a plasma spray device to deposit a coating on a substrate in the vacuum chamber using plasma spray physical vapor deposition; and controlling a source of a reactive gaseous species to introduce a controlled amount of the reactive gaseous species into the vacuum chamber during the plasma spray physical vapor deposition process. The reactive gaseous species may react with at least one constituent of the coating to form a dispersed phase in at least part of the coating.

15 Claims, 3 Drawing Sheets

(56) References Cited

U.S. PATENT DOCUMENTS

| | | | | |
|---|---|---|---|---|
| 2002/0187336 | A1* | 12/2002 | Khan | C23C 4/02 428/323 |
| 2004/0023020 | A1* | 2/2004 | Bose | C23C 4/06 428/323 |
| 2008/0124479 | A1 | 5/2008 | Hazel et al. | |
| 2008/0166489 | A1* | 7/2008 | Strock | C23C 4/02 427/421.1 |
| 2010/0304035 | A1* | 12/2010 | Zehavi | C23C 4/02 427/450 |
| 2012/0308733 | A1 | 12/2012 | Von Niessen et al. | |
| 2013/0071575 | A1 | 3/2013 | Müller | |
| 2013/0115096 | A1 | 5/2013 | Itzel et al. | |
| 2013/0156968 | A1* | 6/2013 | Petorak | C23C 4/134 427/446 |
| 2013/0224393 | A1* | 8/2013 | Hospach | C23C 4/08 427/452 |
| 2013/0224432 | A1* | 8/2013 | Hospach | C23C 4/127 428/119 |
| 2013/0288037 | A1* | 10/2013 | Sun | H01J 37/32082 428/312.8 |
| 2013/0344319 | A1 | 12/2013 | Zhu et al. | |

OTHER PUBLICATIONS

"Product Data Sheet, MultiCoat High Performance Thermal Spray Controller," on Jan. 1, 2015, 8 pp.

"Thermal Spray Equipment Guide," Oerlikon Metco, Issue 12, Dec. 2015, 40 pp.

Extended Search Report from counterpart European Application No. 16162445.7, dated Oct. 6, 2016, 11 pp.

B.J. Harder and D. Zhu, "Plase Spary-Physical Vapor Desposition (PS-PVD) of Ceramics for Protective Coatings", 2011, retrieved from http://ntrs.nasa.gov/archive/nasa/casi.ntrs.gov/20110008752.pdf on Mar. 6, 2015.

Response to Extended Search Report dated Oct. 6, 2016, from counterpart European Application No. 16162445.7, filed Apr. 25, 2017, 9 pp.

* cited by examiner

VACUUM PLASMA SPRAYED COATING INCLUDING OXIDE DISPERSIONS

This application claims the benefit of U.S. Provisional Application No. 62/141,635 filed Apr. 1, 2015, which is incorporated herein by reference in its entirety.

TECHNICAL FIELD

The disclosure relates to techniques for forming oxide dispersions in vacuum plasma sprayed coatings.

BACKGROUND

Ceramic or ceramic matrix composite (CMC) materials may be useful in a variety of contexts where mechanical and thermal properties are important. For example, components of high temperature mechanical systems, such as gas turbine engines, may be made from ceramic or CMC materials. Ceramic or CMC materials may be resistant to high temperatures, but some ceramic or CMC materials may react with some elements and compounds present in the operating environment of high temperature mechanical systems, such as water vapor. Reaction with water vapor may result in the recession of the ceramic or CMC material. These reactions may damage the ceramic or CMC material and reduce mechanical properties of the ceramic or CMC material, which may reduce the useful lifetime of the component. Thus, in some examples, a ceramic or CMC material may be coated with an environmental barrier coating, which may reduce exposure of the substrate to elements and compounds present in the operating environment of high temperature mechanical systems.

SUMMARY

In some examples, the disclosure described a system that includes a vacuum pump, a vacuum chamber, a plasma spray device, a source of a reactive gaseous species, and a computing device. The computing device may be operable to control the vacuum pump to evacuate the vacuum chamber to high vacuum, control the plasma spray device to deposit a coating on a substrate in the vacuum chamber using plasma spray physical vapor deposition, and control the source of the reactive gaseous species to introduce a controlled amount of the reactive gaseous species into the vacuum chamber during the plasma spray physical vapor deposition process. The reactive gaseous species may react with at least one constituent of the coating to form a dispersed phase in at least part of the coating.

In some examples, the disclosure describes a method that includes controlling a vacuum pump to evacuate a vacuum chamber to high vacuum, controlling a plasma spray device to deposit a coating on a substrate in the vacuum chamber using plasma spray physical vapor deposition, and controlling a source of a reactive gaseous species to introduce a controlled amount of the reactive gaseous species into the vacuum chamber during the plasma spray physical vapor deposition process. The reactive gaseous species may react with at least one constituent of the coating to form a dispersed phase in at least part of the coating.

In some examples, the disclosure describes a computer readable storage device comprising instructions that, when executed, cause a computing device to control a vacuum pump to evacuate a vacuum chamber to high vacuum, control a plasma spray device to deposit a coating on a substrate in the vacuum chamber using plasma spray physical vapor deposition, and control a source of a reactive gaseous species to introduce a controlled amount of the reactive gaseous species into the vacuum chamber during the plasma spray physical vapor deposition process. The reactive gaseous species may react with at least one constituent of the coating to form a dispersed phase in at least part of the coating.

The details of one or more examples are set forth in the accompanying drawings and the description below. Other features, objects, and advantages will be apparent from the description and drawings, and from the claims.

DETAILED DESCRIPTION

The disclosure describes systems and techniques for forming a coating including a dispersed phase in at least part of a coating using plasma spray physical vapor deposition (PS PVD). To form the dispersed phase, a reactive gaseous species may be intentionally introduced into a vacuum chamber evacuated to high vacuum during the PS PVD technique. The reactive gaseous species may react with a constituent of the coating to form the dispersed phase in at least part of the coating.

Figure 1:
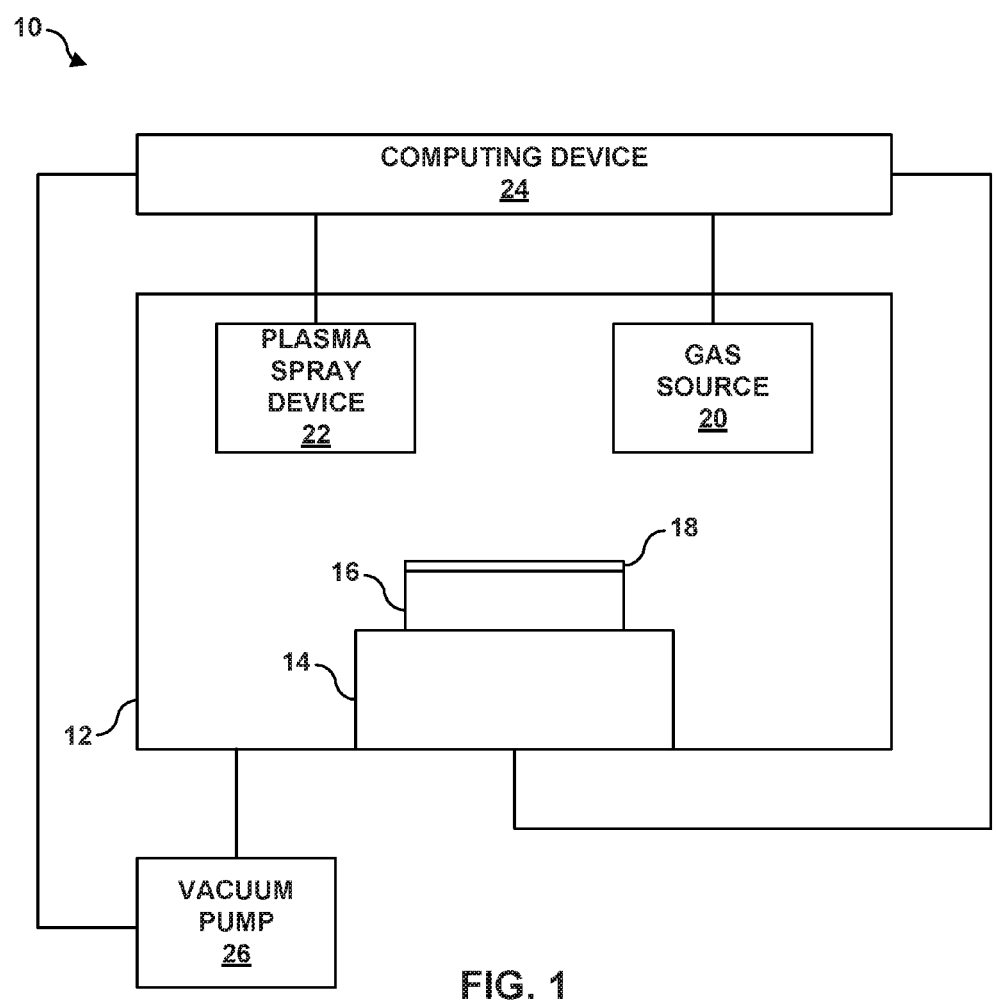
FIG. 1 is a conceptual and schematic diagram illustrating an example system for forming a coating including a dispersed phase in at least part of the coating using plasma spray physical vapor deposition.

FIG. 1 is a conceptual and schematic diagram illustrating an example system 10 for forming a coating 18 including a dispersed phase in at least part of the coating 18 using plasma spray physical vapor deposition. System 10 includes a vacuum chamber 12, which encloses a stage 14, a gas supply 20, and a plasma spray device 22. System 10 also includes a vacuum pump 26 and a computing device 24. A substrate 16 is disposed in enclosure 12 and includes coating 18.

Vacuum chamber 12 may substantially enclose (e.g., enclose or nearly enclose) stage 14, substrate 16, gas supply 20, and plasma spray device 22. Vacuum chamber 12 is fluidically connected to at least one vacuum pump 26, which is operable to pump fluid (e.g., gases) from the interior of vacuum chamber 12 to establish a vacuum in vacuum chamber 12. In some examples, vacuum pump 26 may include multiple pumps or multiple stages of a pump, which together may evacuate vacuum chamber 12 to high vacuum. For example, vacuum pump 26 may include at least one of a scroll pump, a screw pump, a roots pump, a turbomolecular pump, or the like. As used herein, high vacuum may refer to pressures of less than about 10 torr (about 1.33 kilopascals (kPa)). In some examples, the pressure within vacuum chamber 12 during the PS-PVD technique may be between about 0.5 torr (about 66.7 pascals) and about 10 torr (about 1.33 kPa).

In some examples, during the evacuation process, vacuum chamber 12 may be backfilled with a substantially inert atmosphere (e.g., helium, argon, or the like), then the substantially inert gases removed during subsequent evacuation to the target pressure (e.g., high vacuum). In this way, the gas molecules remaining in vacuum chamber 12 under high vacuum may be substantially inert, e.g., to substrate 16 and coating 18.

In some examples, stage 14 may be configured to selectively position and restrain substrate 16 in place relative to stage 14 during formation of coating 18. In some examples, stage 14 is movable relative to plasma spray device 22, gas supply 20, or both. For example, stage 14 may be translatable and/or rotatable along at least one axis to position substrate 16 relative to plasma spray device 22, gas supply 20, or both. Similarly, in some examples, plasma spray device 22, gas supply 20, or both may be movable relative to stage 14 to position plasma spray device 22, gas supply 20, or both relative to substrate 16.

Gas source 20 may include a supply of a reactive gaseous species. In some examples, gas source 20 may include a nozzle or other apparatus within vacuum chamber 12 for introducing the reactive gaseous species into vacuum chamber 12. Gas source 20 may be communicatively coupled to computing device 24, such that computing device 24 may control gas source 20 (e.g., opening or closing a valve, positioning gas source 20, controlling a flow rate of the reactive gaseous species using gas source 20). As described in further detail herein, in some examples, the reactive gaseous species includes oxygen.

Plasma spray device 22 includes a device used to generate a plasma for use in the PS-PVD technique. For example, plasma spray device 22 may include a plasma spray gun including a cathode and an anode separated by a plasma gas channel. As the plasma gas flows through the plasma gas channel, a voltage may be applied between the cathode and anode to cause the plasma gas to form the plasma. In some examples, the coating material may be injected inside plasma spray device 22 such that the coating material flows through part of the plasma gas channel. In some examples, the coating material may be introduced to the plasma external to plasma spray device 22. In some examples, the coating material may be a relatively fine powder (e.g., an average particle size of less than about 5 micrometers) to facilitate vaporization of the coating material by the plasma.

Computing device 24 may include, for example, a desktop computer, a laptop computer, a workstation, a server, a mainframe, a cloud computing system, or the like. Computing device 24 may include or may be one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some examples, the functionality of computing device 24 may be provided within dedicated hardware and/or software modules.

Computing device 24 is configured to control operation of system 10, including, for example, stage 14, gas source 20, plasma spray device 22, and/or vacuum pump 26. Computing device 24 may be communicatively coupled to at least one of stage 14, gas source 20, plasma spray device 22, and/or vacuum pump 26 using respective communication connections. Such connections may be wireless and/or wired connections.

Computing device 24 may be configured to control operation of stage 14, gas source 20, and/or plasma spray device 22 to position substrate 16 relative to gas source 20 and/or plasma spray device 22. For example, as described above, computing device 24 may control gas source 20, and/or plasma spray device 22 to translate and/or rotate along at least one axis to position substrate 16 relative to gas source 20, and/or plasma spray device 22.

As described above, system 10 may be configured to perform a PS-PVD technique to deposit coating 18 on substrate 16. In some examples, substrate 16 may include component of a high temperature mechanical system, such as a gas turbine engine. For example, substrate 16 may be part of a seal segment, a blade track, an airfoil, a blade, a vane, a combustion chamber liner, or the like. In some examples, substrate 16 may include a ceramic or a CMC. Example ceramic materials may include, for example, silicon carbide (SiC), silicon nitride ($Si_3N_4$), alumina ($Al_2O_3$), aluminosilicate, silica ($SiO_2$), transition metal carbides and silicides (e.g., WC, $Mo_2C$, TiC, $MoSi_2$, $NbSi_2$, $TiSi_2$), or the like. In some examples, substrate 16 additionally may include silicon metal, carbon, or the like. In some examples, substrate 16 may include mixtures of two or more of SiC, $Si_3N_4$, $Al_2O_3$, aluminosilicate, silica, silicon metal, carbon, or the like.

In examples in which substrate 16 includes a CMC, substrate 16 includes a matrix material and a reinforcement material. The matrix material includes a ceramic material, such as, for example, silicon metal, SiC, or other ceramics described herein. The CMC further includes a continuous or discontinuous reinforcement material. For example, the reinforcement material may include discontinuous whiskers, platelets, fibers, or particulates. As other examples, the reinforcement material may include a continuous monofilament or multifilament weave. In some examples, the reinforcement material may include SiC, C, other ceramic materials described herein, or the like. In some examples, substrate 16 includes a SiC—SiC ceramic matrix composite.

Coating 18 may include an environmental barrier coating (EBC) or a layer of an EBC. For example, coating 18 may include a bond coat of an EBC, or a ceramic layer of an EBC. A bond coat of an EBC may include, for example, silicon metal, alone, or mixed with at least one other constituent. For example, a bond coat may include silicon metal and at least one of a transition metal carbide, a transition metal boride, a transition metal nitride, mullite (aluminum silicate, $Al_6Si_2O_{13}$), silica, a silicide, an oxide (e.g., silicon oxide, a rare earth oxide, an alkali oxide, or the like), a silicate (e.g., a rare earth silicate or the like), or the like. In some examples, the additional constituent(s) may be substantially homogeneously mixed with silicon metal. In other examples, the additional constituent(s) may form a second phase distinct from the silicon metal phase.

In some examples, coating 18 includes an EBC layer, alone or in addition to a bond coat. In examples in which coating 18 includes an EBC layer in addition to a bond coat, the EBC layer may be on the bond coat. An EBC layer may include constituents and a physical construction selected to reduce contact of underlying layers with chemical species present in the environment in which substrate 16 is used, such as water vapor, calcia-magnesia-alumina-silicate (CMAS; a contaminant that may be present in intake gases of gas turbine engines), or the like. The EBC layer may include at least one of a rare earth oxide, a rare earth silicate, an aluminosilicate, or an alkaline earth aluminosilicate. For example, the EBC layer may include at least one rare earth monosilicate ($RE_2SiO_5$, where RE is a rare earth element), at least one rare earth disilicate ($RE_2Si_2O_7$, where RE is a rare earth element), or combinations thereof.

In some examples, the EBC layer may include an additive in addition to the primary constituents of the EBC layer. For example, the EBC layer may include at least one of $TiO_2$, $Ta_2O_5$, $HfSiO_4$, an alkali metal oxide, or an alkali earth metal oxide. The additive may be added to the EBC layer to modify one or more desired properties of the EBC layer. For example, the additive components may increase or decrease the reaction rate of the EBC layer with calcia-magnesia-alumina-silicate (CMAS; a contaminant that may be present in intake gases of gas turbine engines), may modify the viscosity of the reaction product from the reaction of CMAS and constituent(s) of the EBC layer, may increase adhesion of the EBC layer to the bond coat, may increase or decrease the chemical stability of the EBC layer, or the like. In some examples, the EBC layer may be a substantially non-porous layer (e.g., may include a porosity of less than about 5 volume percent). The EBC layer may include one or more sublayers with different or the same compositions, and the composition of each one or more sublayer may be selected to provide selected properties to the sublayer and to the overall EBC layer.

Unlike some PS-PVD techniques, system 10 includes gas source 20, which may supply a reactive gaseous species, such as oxygen, into vacuum chamber 12 during the PS-PVD technique. The reactive gaseous species may react with a constituent of coating 18 to form a second phase, such as an oxide phase. In some examples, the second phase may be a particulate phase, and may form a relatively fine dispersion within coating 18. For example, coating 18 may include a silicon metal-based bond coat, and the second phase may include silicon oxide (e.g., $SiO_2$). The second phase may affect toughness and crack propagation within coating 18.

Figure 2:
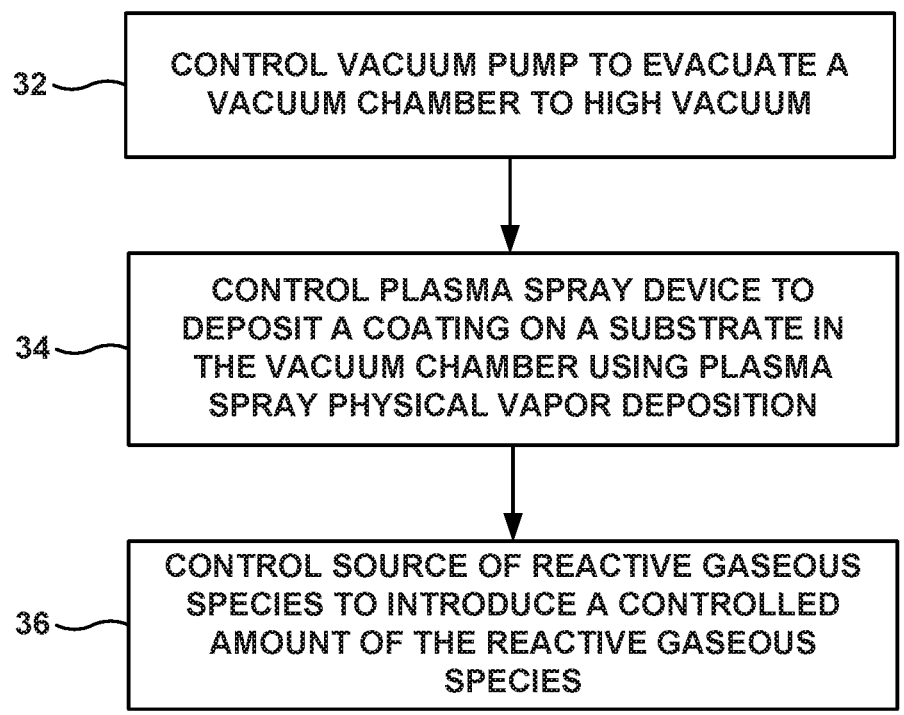
FIG. 2 is a flow diagram illustrating an example technique for forming a coating including a dispersed phase in at least part of a coating using plasma spray physical vapor deposition.
Figure 3:
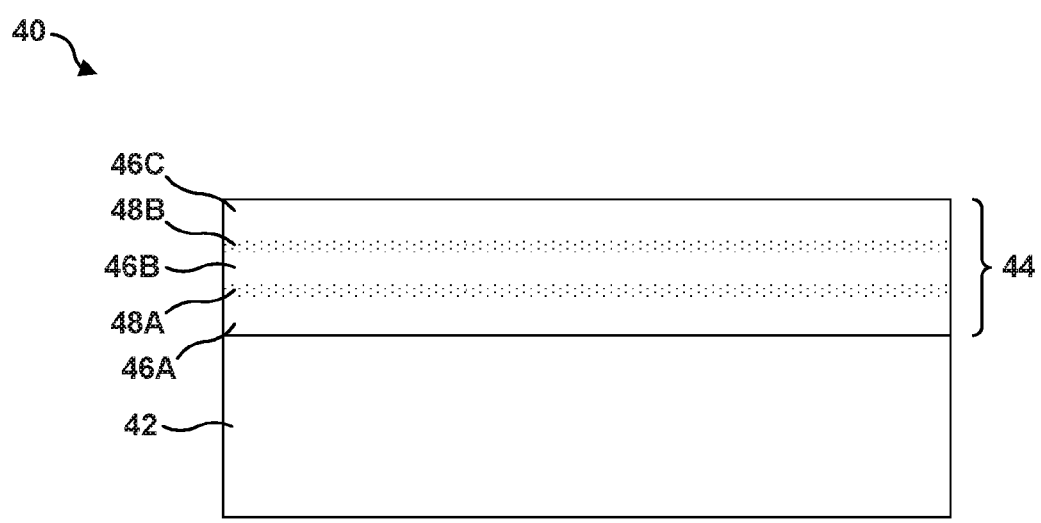
FIG. 3 is a conceptual and schematic diagram illustrating a cross-sectional view of an example article including a coating that includes a dispersed phase in at least part of the coating.

FIG. 2 is a flow diagram illustrating an example technique for forming a coating including a dispersed phase in at least part of a coating using plasma spray physical vapor deposition. FIG. 3 is a conceptual and schematic diagram illustrating a cross-sectional view of an example article 40 including a coating 44 that includes a dispersed phase 48 in at least part of the coating 44. The technique of FIG. 2 will be described with respect to system 10 of FIG. 1 and article 40 of FIG. 3 for ease of description only. A person having ordinary skill in the art will recognize and appreciate that the technique of FIG. 2 may be implemented using systems other than system 10 of FIG. 1, may be used to form articles other than article 40 of FIG. 2, or both.

The technique of FIG. 2 may include, controlling, by computing device 24, vacuum pump 26 to evacuate vacuum chamber 12 to a high vacuum (32). As described above, vacuum pump 26 may be used to evacuate vacuum chamber 12 to high vacuum, e.g., less than about 10 torr (about 1.33 kPa), or between about 0.5 torr (about 66.7 pascals) and about 10 torr (about 1.33 kPa). In some examples, computing device 24 may control vacuum pump 26 and a source of substantially inert gas (e.g., helium, argon, or the like) to evacuate vacuum chamber 12 in multiple pump-downs. For example, computing device 24 may control vacuum pump 26 to evacuate vacuum chamber 12 of the atmosphere present when substrate 16 is placed in vacuum chamber 12. Computing device 24 then may control the source of the substantially inert gas to fill vacuum chamber 12 with the substantially inert gas. Computing device 24 may control vacuum pump 26 to evacuate vacuum chamber 12 of the substantially inert gas (and remaining atmosphere). In some examples, computing device 24 may control the source of the substantially inert gas and vacuum pump 26 to fill and evacuate vacuum chamber 12 at least one time (e.g., a plurality of times) to substantially remove reactive gases from vacuum chamber 12 and leave substantially only inert gases such as helium, argon, or the like in vacuum chamber 12.

The technique of FIG. 2 also may include, controlling, by computing device 24, plasma spray device 22 to deposit coating 18 on substrate 16 in vacuum chamber 12 using PS-PVD (34). In PS-PVD, vacuum chamber 12 is at a pressure lower than that used in low pressure plasma spray. For example, as described above, computing device 24 may control vacuum pump 26 to evacuate vacuum chamber 12 to a high vacuum with a pressure of less than about 10 torr (about 1.33 kPa). In contrast, in low pressure plasma spray, the pressure in a vacuum chamber is between about 50 torr (about 6.67 kPa) and about 200 torr (about 26.66 kPa). Because of the lower operating pressure, the plasma may be larger in both length and diameter, and may have a relatively uniform distribution of temperature and particle velocity.

During the PS-PVD technique, coating material may be introduced into the plasma, e.g., internally or externally to plasma spray device 22. The temperature of the plasma may, in some examples, be above about 6000 K, which may result in vaporization of substantially all (e.g., all or nearly all) of the coating material. The plasma may carry the substantially vaporized coating material toward substrate 16, where the substantially vaporized coating material deposits in a layer on substrate 16. Because the substantially vaporized coating material is carried by the plasma toward substrate, PS-PVD may provide some non line-of-sight capability, depositing coating material on surfaces that are not in direct line of sight with plasma spray device 22. This may facilitate forming coating 18 on substrates with more complex geometry (e.g., non-planar geometry).

The coating material may include, for example, a constituent of a bond coat, such as silicon metal, a constituent of an EBC layer, such as an oxide, or the like.

During the PS-PVD technique, computing device 24 may also control gas source 20, a source of a reactive gaseous species, to introduce a controlled amount of the reactive gaseous species into vacuum chamber 12 during the PS-PVD process (34). In some examples, gas source 20 may introduce a controlled amount of an oxidizing agent, such as oxygen, into vacuum chamber 12. In other examples, gas source 20 may introduce another reactive gaseous species, such as nitrogen, carbon, or the like, into vacuum chamber 12. The reactive gaseous species may be selected to react with a constituent of the coating material, such as silicon.

In some examples, gas source 20 is located, or computing device 24 controls gas source 20 to be positioned, at a location outside of the plasma plume generated by plasma spray device 22. For example, as described above, plasma spray device 22 may generate a relatively large plasma plume, which, in some examples, may be shaped substantially like a cylinder. In some examples, the gaseous reactive species, being introduced outside of the plasma plume, may react with the coating constituent at a "surface" of the plasma plume, e.g., at a circumference of the cylinder.

As the gaseous reactive species reacts with the coating constituent, the gaseous reactive species and the coating constituent may form a compound that forms a second phase within coating 18. For example, when the coating constituent includes silicon and the gaseous reactive species includes oxygen, the resulting compound may include silicon oxide (e.g., $SiO_2$).

In some examples, during the PS-PVD technique, computing device 24 may control plasma spray device 22, stage 14, or both to move plasma spray device 22, substrate 16, or both relative to each other. For example, computing device 24 may be configured to control plasma spray device 22 to scan the plasma plume relative to substrate 16. In some examples, this may cause the cylinder-shaped plasma plume that includes the compound formed by reaction between the gaseous reactive species reacts with the coating constituent adjacent to the circumference of the cylinder, to move relative to the surface of substrate 16.

FIG. 3 is a conceptual diagram illustrating an example article 40 including a substrate 42 and a coating 44 that may be formed by scanning the plasma plume relative to substrate 42. Substrate 42 illustrated in FIG. 3 may be similar to or substantially the same as substrate 16 described with respect to FIG. 1. Coating 44 includes a plurality of coating layers 46A-46C, each of which may include the coating constituent. Coating 44 also includes second phase dispersions 48A and 48B, respectively, disposed at interfaces between respective layer pairs of coating layers 46A-46C. The second phase dispersions 48A and 48B may be a result of scanning the plasma plume relative to substrate 42. For example, as the plasma plume is scanned in a given direction, the second phase material may be primarily at the leading edge and the trailing edge of the plasma plume, while the center of the plasma plume may include primarily unreacted coating constituent. Thus, the top and bottom of a respective coating layer 46A may include more second phase dispersions than a center of a respective coating layer 46A.

By controlling gas source 20 to introduce a controlled amount of a gaseous reactive species into vacuum chamber 12 during the PS-PVD process (36), a controlled amount of the second phase dispersion may be introduced into coating 18 or 44. The gaseous reactive species may be controlled separately from the introduction of the coating material into the plasma plume, allowing formation of the second phase material in controlled amounts and at selected portions of coating 18. The second phase dispersion may affect mechanical and/or chemical properties of coating 18 or 44, such as toughness, crack propagation resistance, or the like. In contrast to some PS-PVD techniques, which operate in a substantially inert environment, the techniques described herein utilize gaseous reactive species in vacuum chamber 12 to form a disperse second phase in coating 18 or 44.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure.

Such hardware, software, and firmware may be implemented within the same device or within separate devices to support the various techniques described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware, firmware, or software components. Rather, functionality associated with one or more modules or units may be performed by separate hardware, firmware, or software components, or integrated within common or separate hardware, firmware, or software components.

The techniques described in this disclosure may also be embodied or encoded in a computer system-readable medium, such as a computer system-readable storage medium, containing instructions. Instructions embedded or encoded in a computer system-readable medium, including a computer system-readable storage medium, may cause one or more programmable processors, or other processors, to implement one or more of the techniques described herein, such as when instructions included or encoded in the computer system-readable medium are executed by the one or more processors. Computer system readable storage media may include random access memory (RAM), read only memory (ROM), programmable read only memory (PROM), erasable programmable read only memory (EPROM), electronically erasable programmable read only memory (EEPROM), flash memory, a hard disk, a compact disc ROM (CD-ROM), a floppy disk, a cassette, magnetic media, optical media, or other computer system readable media. In some examples, an article of manufacture may comprise one or more computer system-readable storage media.

Various examples have been described. These and other examples are within the scope of the following claims.

The invention claimed is:
1. A system comprising:
a vacuum pump;
a vacuum chamber;
a plasma spray device that generates a plasma into which a silicon metal-based coating material is introduced internal of or external to the plasma spray device, wherein the silicon metal-based coating material consists essentially of silicon metal or silicon metal and an additional constituent, and wherein the additional constituent comprises at least one of a transition metal carbide, a transition metal boride, a transition metal nitride, mullite, silica, a silicide, a rare earth oxide, an alkali metal oxide, or a silicate;
a source of a reactive gaseous species; and
a computing device configured to:
control the vacuum pump to evacuate the vacuum chamber to a vacuum of less than 1.33 kPa;
control the plasma spray device to deposit the silicon metal-based coating material in a silicon metal-based coating on a substrate in the vacuum chamber using plasma spray physical vapor deposition, wherein the silicon metal-based coating consists essentially of silicon metal or silicon metal and the additional constituent; and
control the source of the reactive gaseous species to introduce a controlled amount of the reactive gaseous species into the vacuum chamber at a location outside of a vapor plume generated by the plasma spray device during the plasma spray physical vapor deposition process, wherein the reactive gaseous species reacts with the silicon metal of the silicon metal-based coating material to form a dispersed silica phase in at least part of the silicon metal-based coating.

2. The system of claim 1, wherein the source of the reactive gaseous species comprises a source of a gaseous oxidizing agent, and wherein the reactive gaseous species comprises the gaseous oxidizing agent.

3. The system of claim 2, wherein the source of the gaseous oxidizing agent comprises an oxygen source, and wherein the gaseous oxidizing agent comprises oxygen.

4. The system of claim 1, wherein the computing device is further configured to control the plasma spray device to scan the vapor plume comprising constituents of the silicon metal-based coating material over the substrate.

5. The system of claim 4, wherein scanning the vapor plume forms the silicon metal-based coating in layers, and wherein the dispersed silica phase forms proximate to interfaces between the layers.

6. The system of claim 1, wherein the additional constituent forms a second phase distinct from the silica phase within the silicon metal-based coating.

7. A method comprising:
controlling a vacuum pump to evacuate a vacuum chamber to a vacuum of less than 1.33 kPa;
controlling a plasma spray device to generate a plasma into which a silicon metal-based coating material is introduced internal of or external to the plasma spray device, wherein the silicon metal-based coating material consists essentially of silicon metal or silicon metal and an additional constituent, and wherein the additional constituent comprises at least one of a transition metal carbide, a transition metal boride, a transition metal nitride, mullite, silica, a silicide, a rare earth oxide, an alkali metal oxide, or a silicate;
controlling the plasma spray device to deposit the silicon metal-based coating material in a silicon metal-based coating on a substrate in the vacuum chamber using plasma spray physical vapor deposition, wherein the silicon metal-based coating consists essentially of silicon metal or silicon metal and the additional constituent; and
controlling a source of a reactive gaseous species to introduce a controlled amount of the reactive gaseous species into the vacuum chamber at a location outside of a vapor plume generated by the plasma spray device during the plasma spray physical vapor deposition process, wherein the reactive gaseous species reacts with the silicon metal of the silicon metal-based coating material to form a dispersed silica phase in at least part of the silicon metal-based coating.

8. The method of claim 7, wherein the source of the reactive gaseous species comprises a source of a gaseous oxidizing agent, and wherein the reactive gaseous species comprises the gaseous oxidizing agent.

9. The method of claim 8, wherein the source of the gaseous oxidizing agent comprises an oxygen source, and wherein the gaseous oxidizing agent comprises oxygen.

10. The method of claim 7, further comprising controlling the plasma spray device to scan the vapor plume comprising constituents of the silicon metal-based coating material over the substrate.

11. The method of claim 10, wherein scanning the vapor plume forms the silicon metal-based coating in layers, and wherein the dispersed silica phase forms proximate to interfaces between the layers.

12. A computer readable storage device comprising instructions that, when executed, cause a computing device to:
control a vacuum pump to evacuate a vacuum chamber to high vacuum;
control a plasma spray device to generate a plasma into which a silicon metal-based coating material is introduced internal of or external to the plasma spray device, wherein the silicon metal-based coating material consists essentially of silicon metal or silicon metal and an additional constituent, and wherein the additional constituent comprises at least one of a transition metal carbide, a transition metal boride, a transition metal nitride, mullite, silica, a silicide, a rare earth oxide, an alkali metal oxide, or a silicate;
control the plasma spray device to deposit the silicon metal-based coating material in a silicon metal-based coating on a substrate in the vacuum chamber using plasma spray physical vapor deposition, wherein the silicon metal-based coating consists essentially of silicon metal or silicon metal and the additional constituent; and
control a source of a reactive gaseous species to introduce a controlled amount of the reactive gaseous species into the vacuum chamber at a location outside of a vapor plume generated by the plasma spray device during the plasma spray physical vapor deposition process, wherein the reactive gaseous species reacts with the silicon metal of the silicon metal-based coating material to form a dispersed silica phase in at least part of the silicon metal-based coating.

13. The computer readable storage device of claim 12, wherein the source of the reactive gaseous species comprises a source of a gaseous oxidizing agent, and wherein the reactive gaseous species comprises the gaseous oxidizing agent.

14. The computer readable storage device of claim 13, wherein the source of the gaseous oxidizing agent comprises an oxygen source, and wherein the gaseous oxidizing agent comprises oxygen.

15. The computer readable storage device of claim 12, further comprising instructions that, when executed, cause the computing device to control the plasma spray device to scan the vapor plume comprising constituents of the silicon metal-based coating material over the substrate, wherein scanning the vapor plume forms the silicon metal-based coating in layers, and wherein the dispersed silica phase forms proximate to interfaces between the layers.

* * * * *